United States Patent
Sakakura

(10) Patent No.: US 8,552,726 B2
(45) Date of Patent: Oct. 8, 2013

(54) MAGNETIC RESONANCE IMAGING APPARATUS

(75) Inventor: Yoshitomo Sakakura, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 642 days.

(21) Appl. No.: 12/773,234

(22) Filed: May 4, 2010

(65) Prior Publication Data
US 2011/0074419 A1    Mar. 31, 2011

(30) Foreign Application Priority Data

Sep. 28, 2009 (JP) ................................ 2009-223238
Jan. 29, 2010 (JP) ................................ 2010-019551

(51) Int. Cl.
*G01V 3/00* (2006.01)
*G01R 33/385* (2006.01)

(52) U.S. Cl.
USPC ............................ 324/318; 324/319; 324/322

(58) Field of Classification Search
USPC ............................ 324/300–322; 600/407–464
See application file for complete search history.

(56) References Cited

U.S. PATENT DOCUMENTS

| 5,396,173 A * | 3/1995 | Sakakura et al. ............. 324/318 |
| 5,773,976 A | 6/1998 | Sakakura et al. |
| 7,397,244 B2 * | 7/2008 | Cirel ............................ 324/318 |
| 7,511,502 B2 | 3/2009 | Sakakura et al. |
| 7,570,058 B1 * | 8/2009 | Wong et al. .................. 324/318 |
| 7,589,531 B2 * | 9/2009 | Yamashita et al. ............ 324/318 |
| 2007/0268021 A1 * | 11/2007 | Sakakura ...................... 324/318 |
| 2009/0066332 A1 * | 3/2009 | Yatsuo et al. ................. 324/318 |

FOREIGN PATENT DOCUMENTS

| CN | 1763558 A | 4/2006 |
| CN | 101226232 A | 7/2008 |
| JP | 2006-311957 | 11/2006 |

OTHER PUBLICATIONS

Office Action dated Mar. 31, 2012 in CN Application No. 201010164376.8.

* cited by examiner

*Primary Examiner* — Jermele M Hollington
*Assistant Examiner* — Emily Chan
(74) *Attorney, Agent, or Firm* — Nixon & Vanderhye PC

(57) ABSTRACT

A Magnetic Resonance Imaging (MRI) apparatus includes a static magnetic-field magnet that generates a static magnetic field in an imaging area in which a subject is to be placed; a main coil that is provided on the inner side of the static magnetic-field magnet, and applies a gradient magnetic field onto a subject placed in the static magnetic field; and a shield coil that is provided between the static magnetic-field magnet and the main coil, and shields a gradient magnetic field generated by the main coil. Moreover, a Radio Frequency (RF) coil side cooling system including a plurality of cooling pipes that circulates a coolant in pipe is provided on the inner side of the main coil.

15 Claims, 10 Drawing Sheets

MAGNETIC RESONANCE IMAGING APPARATUS

CROSS-REFERENCE TO RELATED APPLICATIONS

This application is based upon and claims the benefit of priority from the prior Japanese Patent Application No. 2009-223238, filed on Sep. 28, 2009, and Japanese Patent Application No. 2010-019551, filed on Jan. 29, 2010; the entire contents of both of which are incorporated herein by reference.

BACKGROUND

1. Technical Field

The present invention relates to a magnetic resonance imaging apparatus.

2. Description of Related Art

A magnetic resonance imaging apparatus is an apparatus that applies a radio-frequency magnetic field onto a subject placed in a static magnetic field, detects a magnetic resonance signal generated from the subject due to the application of the radio-frequency magnetic field, thereby creating an image. Such magnetic resonance imaging apparatus includes a gradient coil that adds spatial positional information to a magnetic resonance signal by applying a gradient magnetic field onto the subject.

The gradient coil is repeatedly supplied with a pulse current while imaging, thereby generating heat to a large extent. Especially in recent years, a speedup in switching of a gradient magnetic field and an enhancement of the strength of a gradient magnetic field are strongly required along with the speedup in an imaging technology, so that heat generation by a gradient coil becomes more marked.

Heat generation by a gradient magnetic field has a possibility of giving influence on the quality of a taken image, or giving a pain to a subject to be imaged. For this reason, for example, a technology of cooling a gradient coil while imaging by circulating a coolant through cooling pipes provided inside the gradient coil has been proposed (for example, see JP-A 2006-311957 (KOKAI)).

FIG. 11 is a schematic diagram for explaining an example of a conventional technology using cooling pipes. FIG. 11 depicts an Active Shield Gradient Coil (ASGC) that is generally used as a gradient coil. In FIG. 11, the upper surface depicts an outer circumferential surface of the ASGC, and the lower surface depicts an inner circumferential surface of the ASGC. An imaging area in which a subject is to be placed is formed on an inner side of the ASGC.

As shown in FIG. 11, the ASGC includes a main coil 1 and a shield coil 2 each of which is formed in a drum shape. Moreover, through-holes forming openings at both ends of a gradient coil 20 are formed as shim-tray insert guides 3, for example, between the main coil 1 and the shield coil 2. In each of the shim-tray insert guides 3, inserted is a shim tray 4 that accommodates therein iron shims 5 that are for correcting ununiformity of a static magnetic field in the imaging area in which the subject is placed. Furthermore, on the inner side of the main coil 1, provided is a Radio Frequency (RF) shield 7 for shielding a radio-frequency magnetic field generated by an RE coil arranged on the inner side of the ASGC.

According to such ASGC, for example, a main-coil side cooling pipe 6a formed in a spiral fashion is provided between the main coil 1 and the shim-tray insert guides 3. Moreover, a shield-coil side cooling pipe 6b formed in a spiral fashion is provided between the shield coil 2 and the shim-tray insert guides 3. The ASGC is cooled by circulating a coolant, such as water, through the main-coil side cooling pipe 6a and the shield-coil side cooling pipe 6b.

However, recently, magnetic resonance imaging apparatuses tend to have a large diameter of a bore that forms an imaging area. As the diameter of the bore getting larger, the diameter of a gradient coil also becomes larger, consequently, electricity supplied to the gradient coil becomes larger. As a result, heat generation by the gradient coil is increased to much greater extent, correspondingly, a temperature rise in the imaging area on the inner side of the gradient coil becomes more marked.

SUMMARY

According to one aspect of the present invention, a magnetic resonance imaging apparatus includes a magnetic resonance imaging apparatus comprising: a static magnetic-field magnet that generates a static magnetic field in an imaging area in which a subject is to be placed; a main coil that is provided on an inner side of the static magnetic-field magnet, and applies a gradient magnetic field onto the subject placed in the static magnetic field; a shield coil that is provided between the static magnetic-field magnet and the main coil, and shields the gradient magnetic field generated by the main coil; and an inner-layer cooling pipe that is provided on an inner side of the main coil, and circulates a coolant in the cooling pipe.

According to another aspect of the present invention, a magnetic resonance imaging apparatus includes a magnetic resonance imaging apparatus comprising: a static magnetic-field magnet that generates a static magnetic field in an imaging area in which a subject is to be placed; a main coil that is provided on an inner side of the static magnetic-field magnet, and applies a gradient magnetic field onto a subject placed in the static magnetic field; an inner-layer cooling pipe that is provided on an inner side of the main coil, and circulates a coolant in the inner-layer cooling pipe; and an outer-layer cooling pipe that is provided on an outer side of the main coil, and circulates a coolant in the outer-layer cooling pipe, wherein the inner-layer cooling pipe and the outer-layer cooling pipe are provided so as to be on opposite sides of the main coil.

BRIEF DESCRIPTION OF EXEMPLARY EMBODIMENTS

DETAILED DESCRIPTION OF THE INVENTION

Exemplary embodiments of a Magnetic Resonance Imaging apparatus (hereinafter, "MRI apparatus") according to the present invention will be explained below in detail with reference to the accompanying drawings. The present invention is not limited by the following embodiments. Moreover, the following embodiments are explained below in a case where water (hereinafter, "cooling water") is used as a coolant for cooling a gradient coil.

Figure 1:
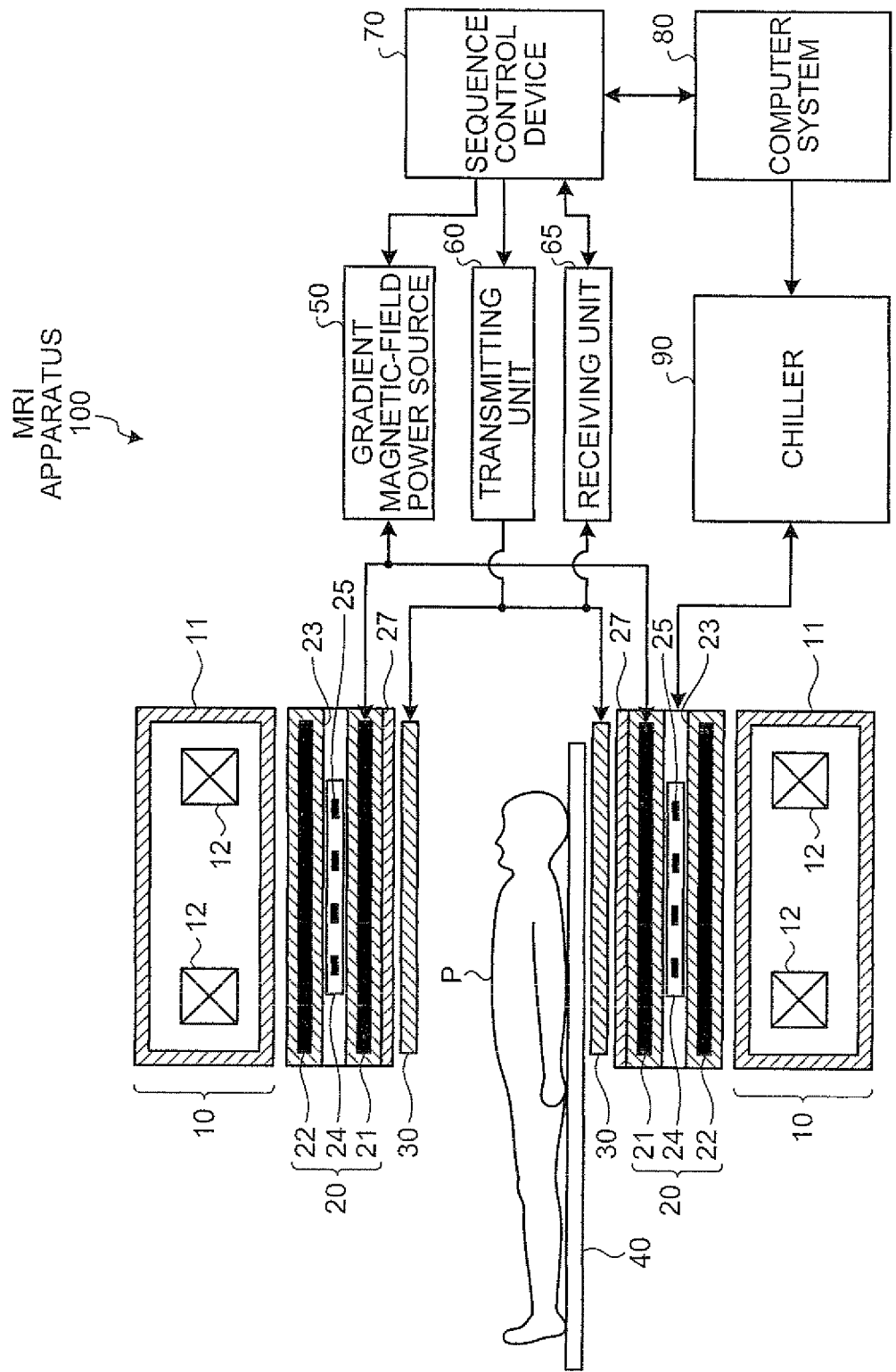
FIG. 1 is a schematic diagram of a configuration of a Magnetic Resonance Imaging (MRI) apparatus according to an embodiment of the present invention.

First of all, a configuration of an MRI apparatus 100 according to an embodiment of the present invention is explained below with reference to FIG. 1. FIG. 1 is a schematic diagram of a configuration of the MRI apparatus 100 according to the embodiment. As shown in FIG. 1, the MRI apparatus 100 includes a static magnetic-field magnet 10, a gradient coil 20, a Radio Frequency (RF) coil 30, a top plate 40, a gradient magnetic-field power source 50, a transmitting unit 60, a receiving unit 65, a sequence control device 70, a computer system 80, and a chiller 90.

The static magnetic-field magnet 10 includes a vacuum container 11 that is formed in a substantial drum shape, and superconducting coils 12 that are immersed in a cooling liquid in the vacuum container 11; and generates a static magnetic field inside a bore (a space inside the drum of the static magnetic-field magnet 10), which is an imaging area.

The gradient coil 20 is formed in a substantial drum shape, and provided, on the inner side of the static magnetic-field magnet 10. The gradient coil 20 is a general Active Shield Gradient Coil (ASGC), and includes a main coil 21 and a shield coil 22. The main coil 21 applies onto a subject P gradient magnetic fields of which strengths vary in directions of the x-axis, the y-axis, and the z-axis, with a current supplied from the gradient magnetic-field power source 50. The shield coil 22 shields a gradient magnetic field generated by the main coil 21 by generating a magnetic field on the outer side of the main coil 21 with a current supplied from the gradient coil 20.

Shim-tray insert guides 23 are formed between the main coil 21 and the shield coil 22. In each of the shim-tray insert guides 23, inserted is a shim tray 24 that accommodates therein iron shims 25 that are for correcting ununiformity of a static magnetic field inside the bore. Moreover, an RF shield 27 configured to shield a radio-frequency magnetic field generated by the RP coil 30 is provided between the main coil 21 and the RF coil 30. Structures of the gradient coil 20 and the RF shield 27 will be explained later in detail.

The RF coil 30 is anchored on the inner side of the gradient coil 20 on opposite sides of the subject P. The RF coil 30 applies a radio-frequency magnetic field onto the subject P based on an RS pulse transmitted from the transmitting unit 60. Moreover, the RF coil 30 receives a magnetic resonance signal emitted from the subject P by excitation of hydrogen nuclei.

The top plate 40 is provided on a not-shown bed in a movable manner in the horizontal direction; and when performing a scan, the subject P is placed on the top plate 40, and then the top plate 40 is moved into the bore. The gradient magnetic-field power source 50 supplies power to the gradient coil 20 based on an instruction from the sequence control device 70.

The transmitting unit 60 transmits an RS pulse to the RF coil 30 based on an instruction from the sequence control device 70. The receiving unit 65 detects a magnetic resonance signal received by the RF coil 30, and transmits raw data obtained by digitizing the detected magnetic resonance signal, to the sequence control device 70.

The sequence control device 70 performs a scan of the subject P by activating the gradient magnetic-field power source 50, the transmitting unit 60, and the receiving unit 65, under the control of the computer system 80. As a result of performing a scan, when raw data is transmitted from the receiving unit 65, the sequence control device 70 transmits the raw data to the computer system 80.

The computer system 80 controls the whole of the MRI apparatus 100. For example, the computer system 80 receives input of imaging conditions from an operator via an input unit, and causes the sequence control device 70 to execute a scan based on the received imaging conditions. Moreover, the computer system 80 reconstructs an image from raw data transmitted from the sequence control device 70. Furthermore, the computer system 80 displays the reconstructed image onto a display unit.

The chiller 90 supplies cooling water to each of a plurality of cooling pipes provided to the gradient coil 20. Although the embodiment is explained in a case where cooling water is used as a coolant, other kinds of coolants can be used.

Figure 2:
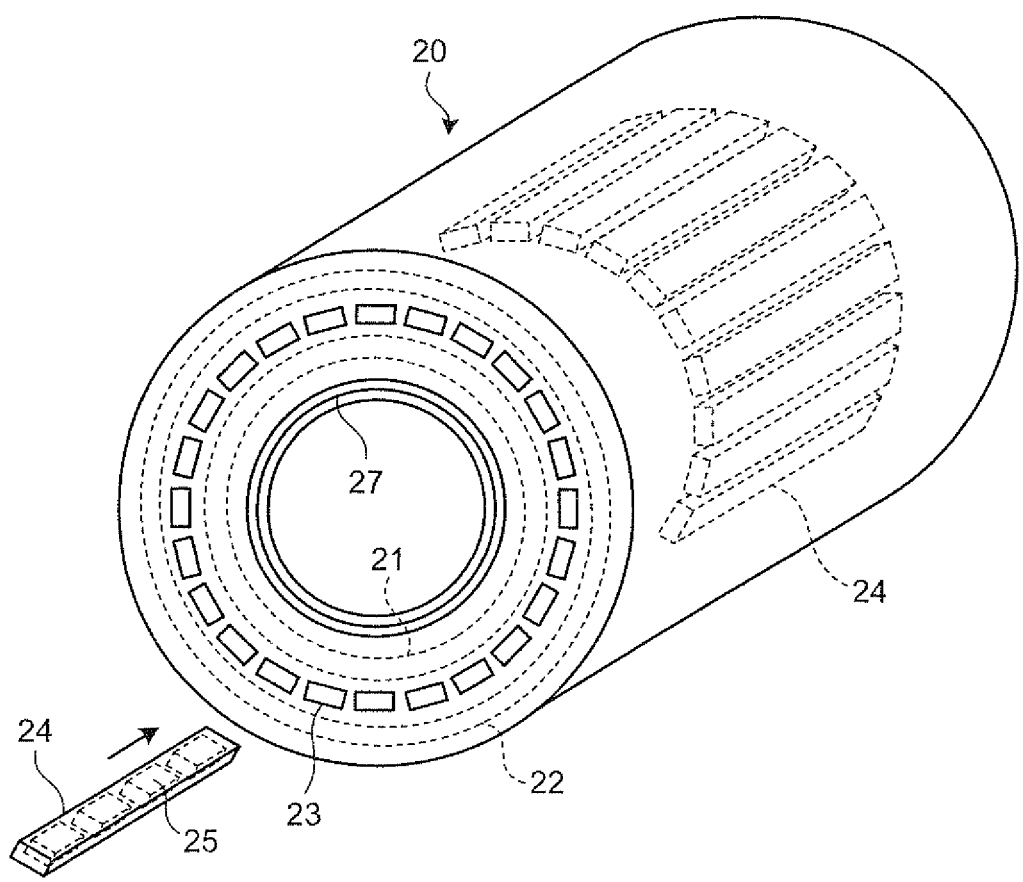
FIG. 2 is a perspective view of a structure of a gradient coil.

A structure of the gradient coil 20 shown is explained below with reference to FIGS. 2 and 3. FIG. 2 is a perspective view of a structure of the gradient coil 20. As shown in FIG. 2, the gradient coil 20 includes the main coil 21, the shield coil 22, and The RF shield 27, each of which is formed in a substantial drum shape. The shield coil 22 is provided on the outer side of the main coil 21, the RF shield 27 is provided on the inner side of the main coil 21.

Furthermore, between the main coil 21 and the shield coil 22, a plurality of shim-tray insert guides 23 is formed. Each of the shim-tray insert guides 23 is a through-hole that forms respective openings at the both ends of the gradient coil 20, and is formed along the whole length in the longitudinal direction of the gradient coil 20. The shim-tray insert guides 23 are formed so as to be in parallel with each other with regular intervals in the circumferential direction in a region between the main coil 21 and the shield coil 22. The shim tray 24 is inserted in each of the shim-tray insert guides 23.

The shim tray 24 is manufactured from a resin that is a non-magnetic and nonconductive material, and formed in a substantial stick shape. The shim tray 24 accommodates a certain number of the iron shims 25. The shim tray 24 is inserted into each of the shim-tray insert guides 23, and anchored in the central part of the gradient coil 20.

A plurality of cooling pipes is embedded in various places in the gradient coil 20 spirally along the drum shape, although they are omitted in FIG. 2. FIG. 3 is a structure diagram that depicts an internal structure of the gradient coil 20. FIG. 3 depicts part of the gradient coil 20. In FIG. 3, the surface of the upper side denotes the outer circumferential surface of the gradient coil 20, and the surface of the lower side denotes the inner circumferential surface of the gradient coil 20. On the inner side of the gradient coil 20, formed is an imaging area in which a subject is to be placed.

Under such configuration, according to the embodiment, cooling pipes are provided inside the gradient coil 20, and cooling pipes are also provided in the innermost layer of the gradient coil 20. Accordingly, the embodiment is configured to enhance cooling of the gradient coil 20, and to be able to suppress a temperature rise in the imaging area in which the subject is placed.

Figure 3:
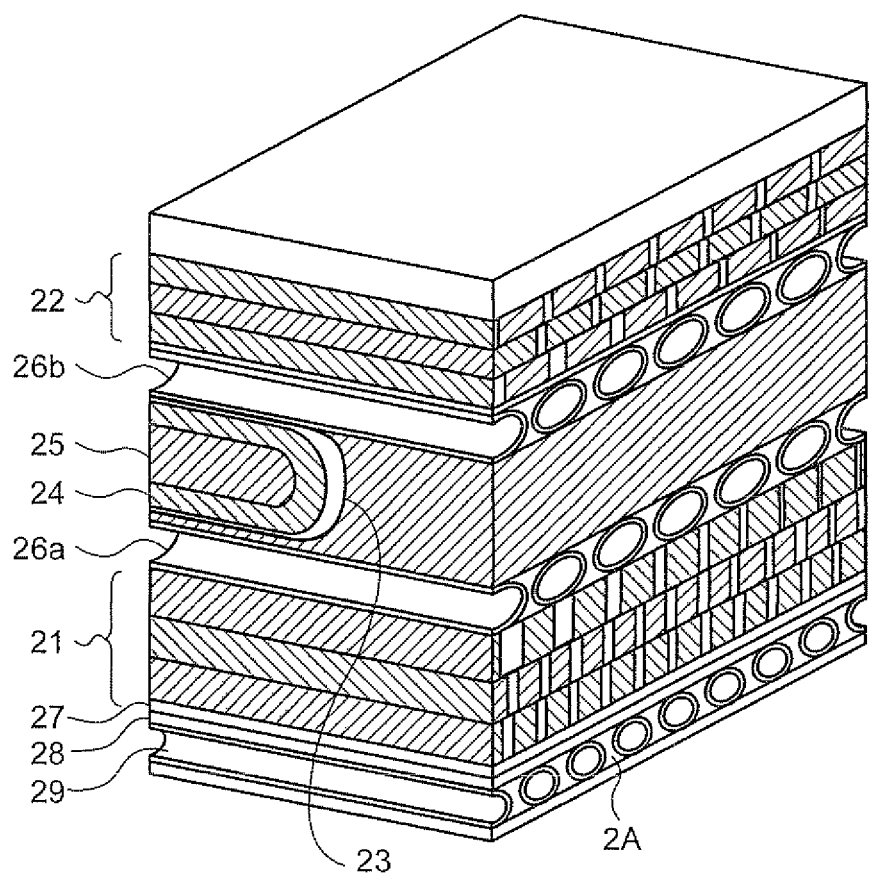
FIG. 3 is a structure diagram that depicts an internal structure of the gradient coil.

As shown in FIG. 3, specifically, between the shim-tray insert guides 23 and the main coil 21, a main-coil side cooling pipe 26a formed in a spiral fashion is embedded. Moreover, between the shim-tray insert guides 23 and the shield coil 22, a shield-coil side cooling pipe 26b formed in a spiral fashion is embedded. Cooling water sent from the chiller 90 flows into the main-coil side cooling pipe 26a and the shield-coil side cooling pipe 26b, and the flowing-in cooling water circulates inside the gradient coil 20 through each cooling pipe, and then flows out to the outside of the gradient coil 20. In this way, the main coil 21, the shield coil 22, and the iron shims 25 are cooled by circulating cooling water through the main-coil side cooling pipe 26a and the shield-coil side cooling pipe 26b.

An RF-coil side cooling system 29 is provided on the inner side of the main coil 21. According to the embodiment, the RF-coil side cooling system 29 is provided on the inner side of the RF shield 27 that is provided on the inner side of the main coil 21. The RF-coil side cooling system 29 includes a plurality of cooling pipes that are formed in a spiral fashion by using copper. A configuration of the RF-coil side cooling system 29 will be explained later in detail.

For example, if assuming that cooling pipes are provided between the main coil 21 and the RR shield 27, the RF shield 27 is closer to the RR coil 30 by the width of the cooling pipes, consequently, the RF coil 30 needs to generate a stronger radio-frequency magnetic field. However, as the radio-frequency magnetic field is strengthened, a Specific Absorption Rate (SAR) is increased, so that there is a possibility that the safety of the subject is decreased.

By contrast, according to the embodiment, the RF-coil side cooling system 29 is provided on the inner side of the RF shield 27, so that a sufficient distance can be ensured between the RF shield 27 and the RF coil 30. Accordingly, the strength of a radio-frequency magnetic field does not need to be strengthened, so that the safety of the subject can be maintained.

Moreover, the cooling pipes included in the RF-coil side cooling system 29 are formed so as to have a smaller pipe diameter than the pipe diameter of the main-coil side cooling pipe 26a. Furthermore, the cooling pipes included in the RF-coil side cooling system 29 are formed so as to have narrower intervals of the spiral than those of the main-coil side cooling pipe 26a. Moreover, the cooling pipes included in the RF-coil side cooling system 29 are each formed so as to have an elliptic cross section compressed in a multilayered direction of the gradient coil 20.

Moreover, a low dielectric substance 2A is filled between the cooling pipes included in the RF-coil side cooling system 29. The low dielectric substance described above can be, for example, Teflon (registered trademark), or Polyethylene Terephthalate (PET). Accordingly, each of the cooling pipes included in the RF-coil side cooling system 29 can be prevented from electrically coupling.

An insulating film 28 that is formed from an insulating material is provided between the cooling pipes included in the RF-coil side cooling system 29 and the RF shield 27. The insulating material described above can be, for example, Teflon (registered trademark), or PET. Alternatively, the insulating material can be a Fiberglass Reinforced Plastics (FRP). Accordingly, electrical coupling of the cooling pipes included the RF-coil side cooling system 29 and the RF shield 27 can be avoided.

The RF-coil side cooling system 29 and the main-coil side cooling pipe 26a are provided so as to be on opposite sides of the main coil 21. Accordingly, the main coil 21 can be effectively cooled.

Figure 4:
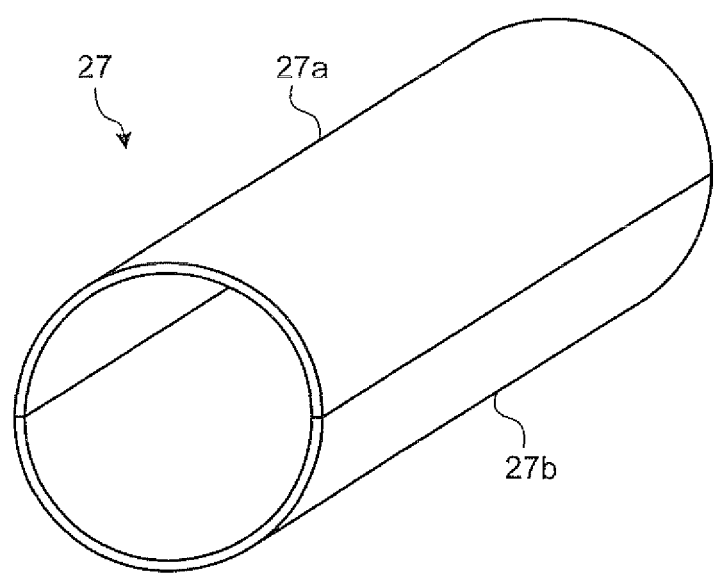
FIG. 4 is a schematic diagram of an appearance of a Radio Frequency (RE) shield.

A structure of the RF shield 27 is explained below with reference to FIGS. 4 and 5. FIG. 4 is a schematic diagram of an appearance of the RF shield 27. As shown in FIG. 4, the RF shield 27 is formed in a substantial drum shape. For example, as shown in FIG. 4, the RF shield 27 is formed by combining two sheets of conductive plates 27a and 27b each of which is curved so as to have a semicircle cross section. Although a case of using two sheets of conductive plates is explained in this example, the RF shield 27 can be formed of one sheet of conductive plate, or can be formed by combining three or more sheets of conductive plates.

A plurality of slits is formed on the front and back surfaces of the RF shield 27 at certain positions. FIG. 5 is a development view of the RF shield 27. in FIG. 5, a direction denoted by an arrow A of a broken line indicates the circumferential direction of the RF shield 27, and a direction denoted by an arrow B of a broken line indicates the drum-extending direction of the RF shield 27. An area G denotes an area in which the RF shield 27 and the main coil 21 overlap each other when the RF shield 27 is provided between the main coil 21 and the RF coil 30. An area R denotes an area in which the main coil 21 overlaps with an area of a conductor pattern formed on the RE coil 30 when the RF shield 27 is provided between the main coil 21 and the RE coil 30.

Figure 5:
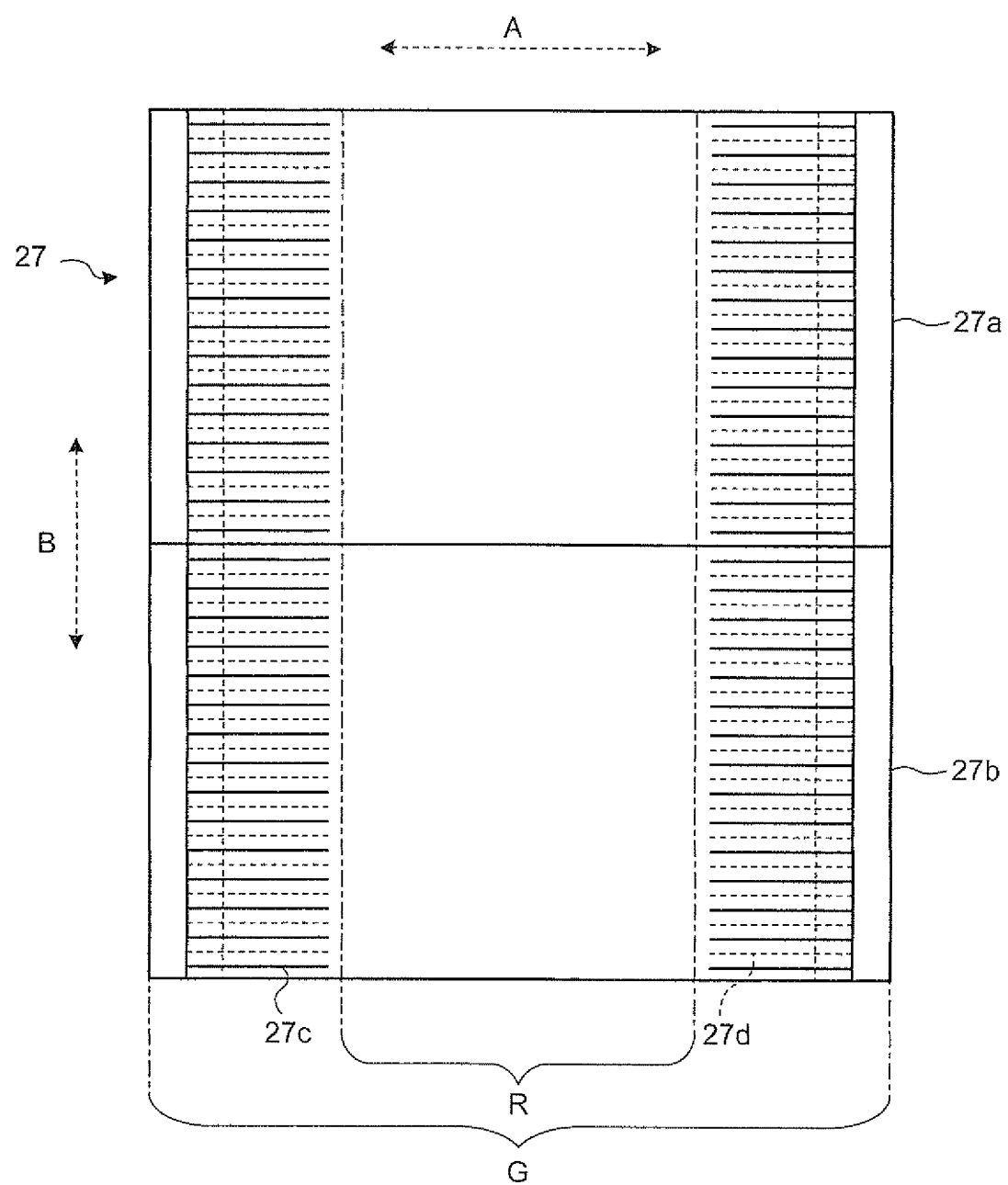
FIG. 5 is a development view of the RF shield.

As shown in FIG. 5, on the front surface of the RF shield 27, a plurality of slits 27c is formed at a position within the area G and outside the area R along the drum-extending direction. On the back surface of the RF shield 27, a plurality of slits 27d is formed along the drum-extending direction. Each of the slits 27d formed on the back surface of the RF shield 27 is formed to be positioned between each of the slits 27c formed on the front surface.

Figure 6:
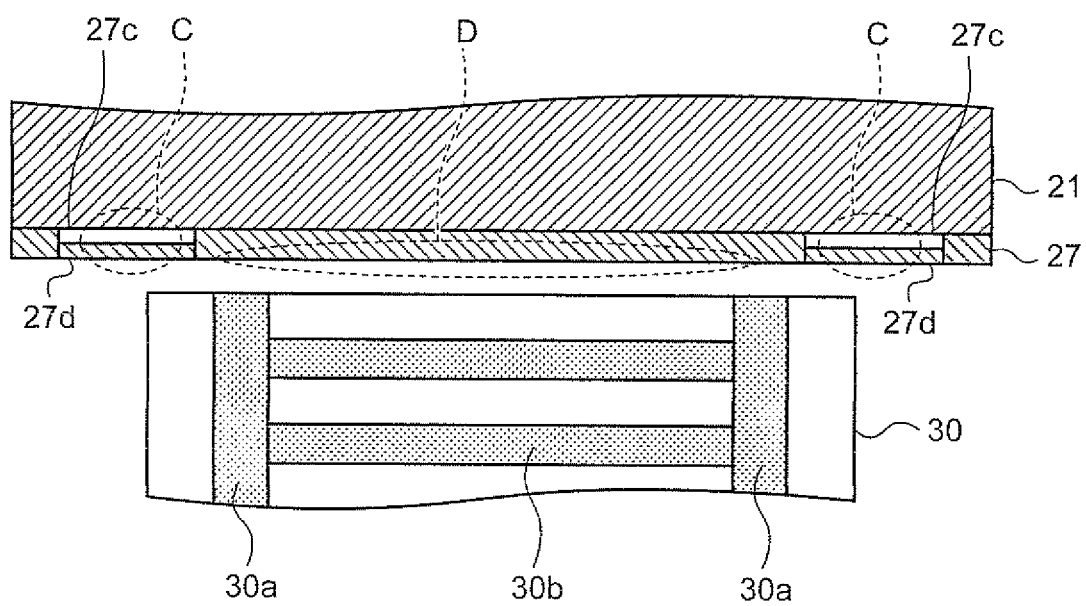
FIG. 6 is a schematic diagram for explaining a role of each slit formed in the RF shield.

A role of each of the slits 27c and the slits 27d formed on the RF shield 27 is explained below. FIG. 6 is a schematic diagram for explaining a role of each of the slits 27c and the slits 27d formed on the RF shield 27. FIG. 6 depicts a state that the RF shield 27 is provided between the main coil 21 and the RE coil 30. As shown in FIG. 6, for example, as a conductor pattern, end rings 30a are formed at the both ends of the RF coil 30 in the drum-extending direction, and rungs 30b are formed so as to bridge between the end rings 30a.

As shown in FIG. 6, under the state that the RF shield 27 is provided between the main coil 21 and the RE coil 30, the slits 27c and the slits 27d are each positioned between the end rings 30a at both ends of the RE coil 30 and both ends of the main coil 21 (a position C shown in FIG. 6). Under ordinary circumstances, a gradient magnetic field generated by the main coil 21 frequently fluctuates, so that an eddy current is markedly produced. However, according to the embodiment, because the slits 27c and the slits 27d are formed, a closed loop of an eddy current produced at the position is interrupted. As a result, an eddy current produced on the RF shield 27 can be reduced.

On the other hand, slits are not formed in an area on the RF shield 27 facing to the end rings 30a and the rungs 30b formed on the RE coil 30 (an area D shown in FIG. 6). Accordingly, a radio-frequency magnetic field generated from the RE coil 30 toward the main coil 21 can be shielded with high precision.

Conventionally, to reduce an eddy current produced by a gradient magnetic field, slits are formed on an RF shield along patterns of a radio-frequency magnetic field, and intervals between the patterns are coupled by providing condensers so as to bridge the slitsfor RF currents. However, the RF shield 27 according to the embodiment can reduce production of eddy currents. without using condensers, and can shield a radio-frequency magnetic field with high precision.

Figure 7:
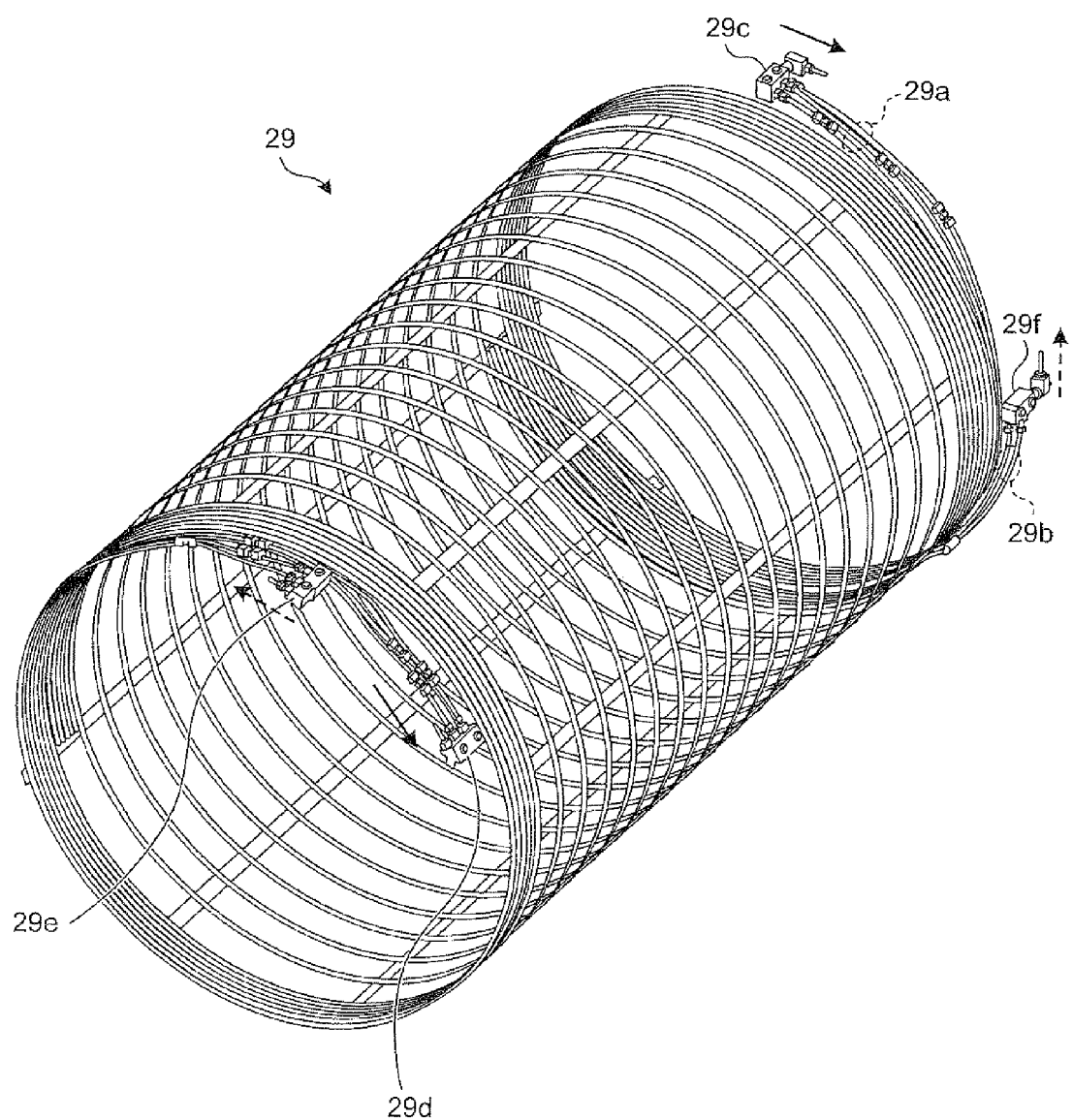
FIG. 7 is a perspective view of an overall configuration of an RF-coil side cooling system.

A configuration of the RF-coil side cooling system 29 is explained below with reference to FIGS. 7 to 9. FIG. 7 is a perspective view of an overall configuration of the RF-coil side cooling system 29. As shown in FIG. 7, the RF-coil side cooling system 29 includes three first cooling pipes 29a each of which is formed in a spiral fashion, and three second cooling pipes 29b that are provided in parallel with the first cooling pipes 29a. A manifold that causes cooling water to branch or to join is provided at each end of the first cooling pipes 29a and the second cooling pipes 29b. The manifold is formed from a metal, such as brass.

Specifically, an inlet-side manifold 29c is provided at one end of the first cooling pipes 29a, and an outlet-side manifold 29d is provided at the other end. The inlet-side manifold 29c branches cooling water supplied from the chiller 90, and flows the branched cooling water into each of the three of the first cooling pipes 29a. The outlet-side manifold 29d causes the cooling water flowing out from the three of the first cooling pipes 29a to join each other, and returns it to the chiller 90. The arrows of the solid lines shown in FIG. 7 indicate directions of cooling water flowing in the first cooling pipes 29a.

Similarly, an inlet-side manifold 29e is provided at one end of the second cooling pipes 29b, and an outlet-side manifold 29f is provided at the other end. The inlet-side manifold 29e branches cooling water supplied from the chiller 90, and flows the branched cooling water into each of the three of the second cooling pipes 29b. The outlet-side manifold 29f causes the cooling water flowing out from the three of the second cooling pipes 29b to join each other, and returns it to the chiller 90. The arrows of the broken lines shown in FIG. 7 indicate directions of cooling water flowing in the second cooling pipes 29b.

As shown in FIG. 7, the inlet-side manifold 29c of the first cooling pipes 29a and the inlet-side manifold 29e of the second cooling pipes 29b are provided at respective ends on opposite sides. The outlet-side manifold 29d of the first cooling pipes 29a and the outlet-side manifold 29f of the second cooling pipes 29b are provided on opposite sides. In other words, the first cooling pipes 29a and the second cooling pipes 29b circulates cooling water in opposite directions, respectively.

Accordingly, the temperature of cooling water flowing in the second cooling pipes 29b is low at a position where the temperature of cooling water flowing in the first cooling pipes 29a is high, on the contrary, the temperature of cooling water flowing in the first cooling pipes 29a is low at a position where the temperature of cooling water flowing in the second cooling pipes 29b is high. Therefore, the temperature of cooling water is made more uniform in the RF-coil side cooling system 29 as a whole, the imaging area in which the subject is placed can be more uniformly cooled.

Each of the cooling pipes and each of the manifolds included in the RF-coil side cooling system 29 are connected to each other via a pipe formed from an insulating material. FIG. 8 is a schematic diagram that depicts one end of cooling pipes included in the RF-coil side cooling system 29. FIG. 9 is a schematic diagram that depicts the other end of the cooling pipes included in the RF-coil side cooling system 29.

Figure 8:
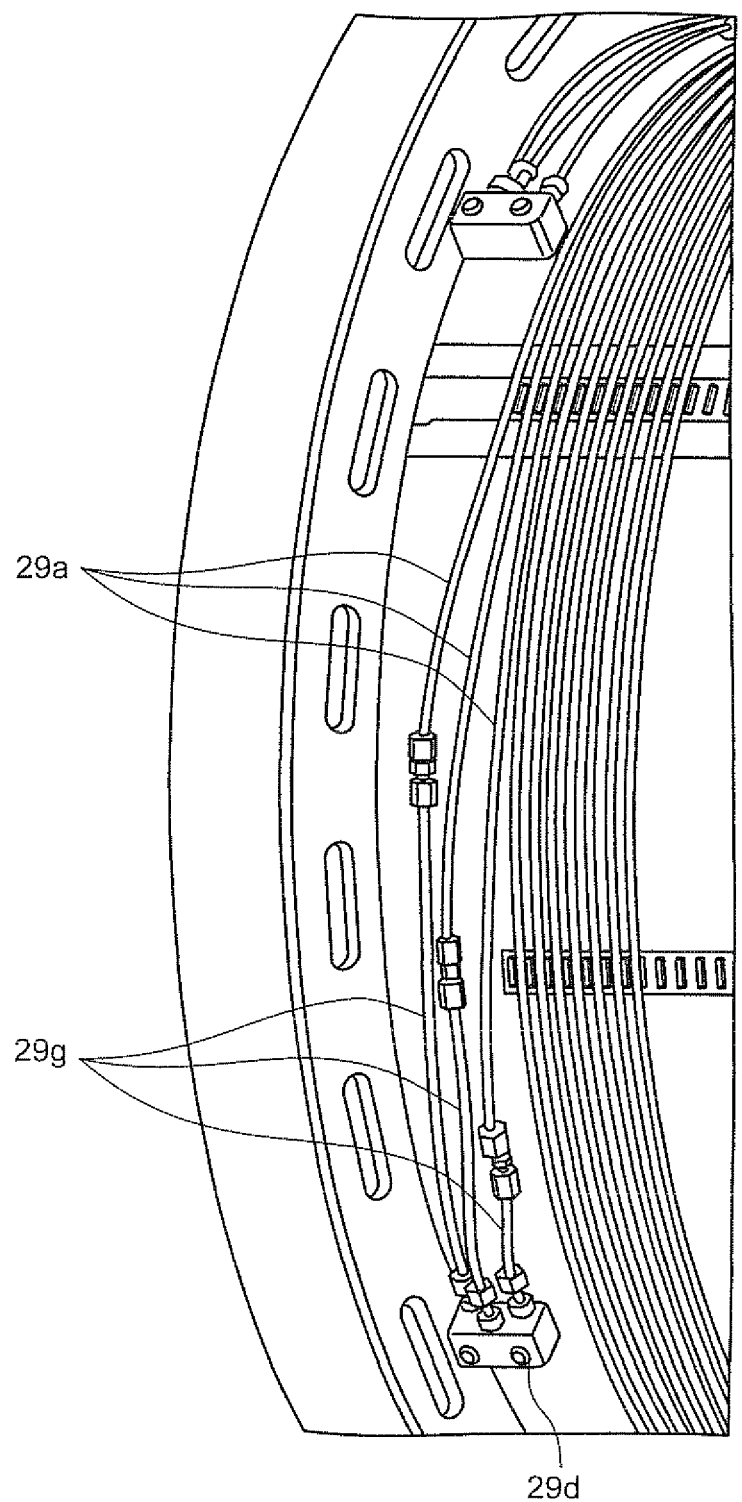
FIG. 8 is a schematic diagram that depicts one end of cooling pipes included in the RF-coil side cooling system.
Figure 9:
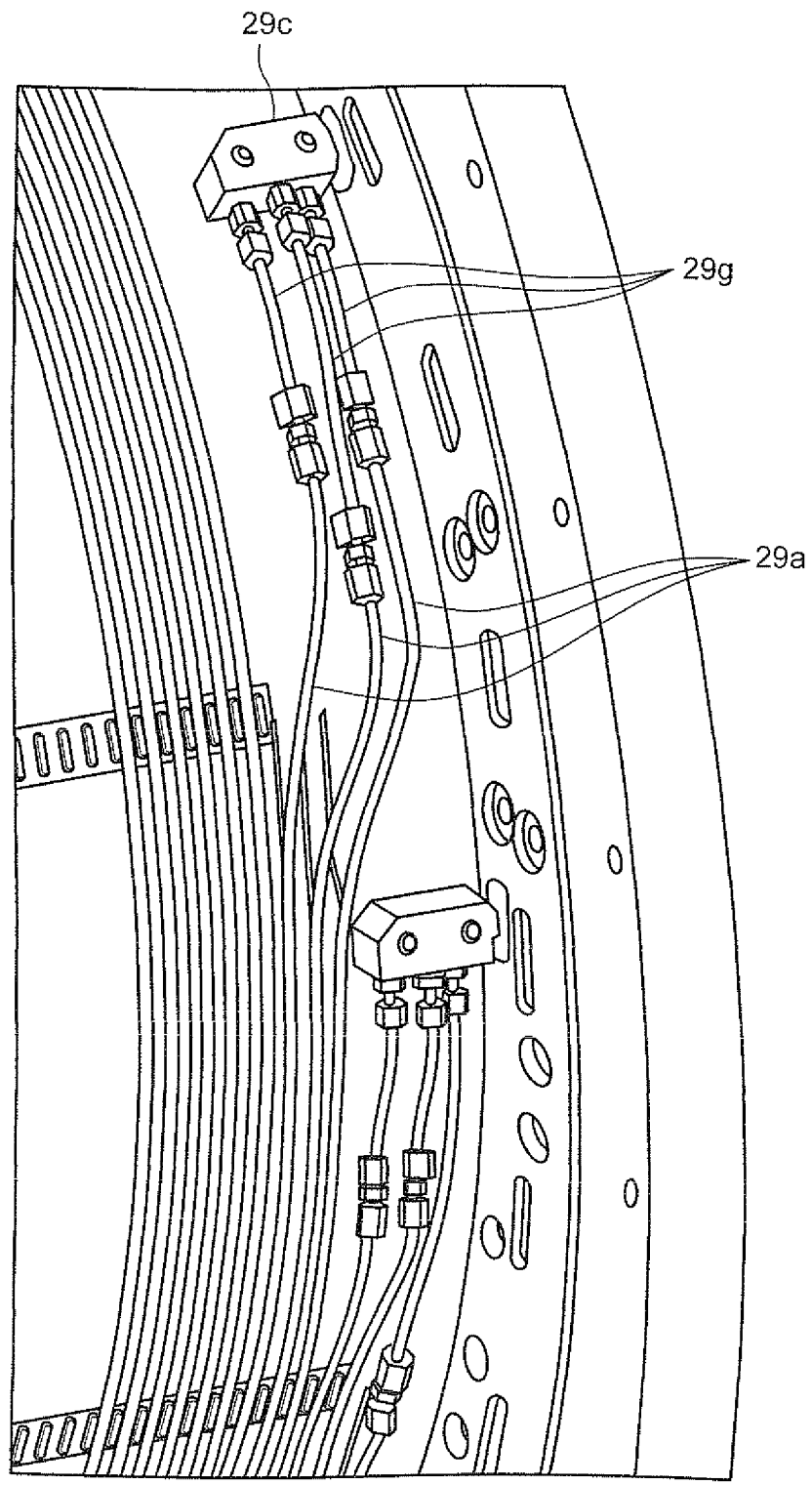
FIG. 9 is a schematic diagram that depicts the other end of the cooling pipes included in the RF-coil side cooling system.

As shown in FIG. 8, for example, one end of the first cooling pipes 29a is connected to the outlet-side manifold 29d via tubes 29g formed from an insulating material. As shown in FIG. 9, for example, the other end of the first cooling pipes 29a is connected to the inlet-side manifold 29c via the tubes 29g formed from the insulating material. The insulating material used here can be, for example, Teflon (registered trademark), or PET. The second cooling pipes 29b is also connected to each of the inlet-side manifold 29e and the outlet-side manifold 29f via a tube formed from the insulating material.

In this way, a tube formed from an insulating material is provided between each of the cooling pipes and each of the manifolds included in the RF-coil side cooling system 29, thereby avoiding forming an electrical closed loop by each of the cooling pipes included in the RF-coil side cooling system 29.

Although a case of using a manifold made from a metal, such as brass, is explained in this example, a manifold formed from an insulating material, such as Teflon (registered trademark) or PET, can be used. Accordingly, an electrical closed loop can be securely prevented from forming by each of the cooling pipes.

As described above, according to the embodiment, the MRI apparatus 100 includes the static magnetic-field magnet 10 that generates a static magnetic field in an imaging area in which the subject P is to be placed; the main coil 21 that is provided on the inner side of the static magnetic-field magnet 10 and applies a gradient magnetic field onto the subject P placed in a static magnetic field; and the shield coil 22 that is provided between the static magnetic-field magnet 10 and the main coil 21, and shields a gradient magnetic field generated by the main coil 21. The RF-coil side cooling system 29 including a plurality of cooling pipes that circulate a coolant in the pipes is provided on the inner side of the main coil 21. Therefore, according to the embodiment, cooling of the gradient coil 20 can be enhanced, and a temperature rise in the imaging area in which the subject P is placed can be suppressed.

Moreover, according to the embodiment, the RF shield 27 that shields a radio-frequency magnetic field generated by the RF coil 30 is provided between the main coil 21 and the RF-coil side cooling system 29. Accordingly, a sufficient distance can be ensured between the RF shield 27 and the RE coil 30. Therefore, according to the embodiment, the strength of a radio-frequency magnetic field does not need to be strengthened, so that the safety of the subject P can be maintained.

Furthermore, according to the embodiment, the main-coil side cooling pipe 26a is provided on the outer side of the main coil 21. Therefore, according to the embodiment, the main coil 21 is cooled from each of its inner side and its outer side, cooling of the gradient coil 20 can be further enhanced.

Moreover, according to the embodiment, the cooling pipes included in the RF-coil side cooling system 29 are formed so as to have a smaller pipe diameter than the pipe diameter of the main-coil side cooling pipe 26a. Therefore, according to the embodiment, the diameter of the bore that is the imaging area can be made larger.

Furthermore, according to the embodiment, each of the cooling pipes included in the RF-coil side cooling system 29 is formed so as to have an elliptic cross section compressed in the multilayered direction of the gradient coil 20. Accordingly, the diameter of the bore that is the imaging area can be further widened.

Moreover, according to the embodiment, the cooling pipes included in the RF-coil side cooling system 29 and the main-coil side cooling pipe 26a are arranged as each formed in a spiral fashion. The cooling pipes included in the RF-coil side cooling system 29 are formed so as to have narrower intervals of the spiral than those of the main-coil side cooling pipe 26a. Therefore, according to the embodiment, the imaging area in which the subject P is placed can be cooled more uniformly.

Moreover, according to the embodiment, the RF shield 27 is formed in a substantial drum shape by using a conductor, and provided between the main coil 21, and the RE coil 30, and the slits 27c and the slits 27d are formed at positions at which an eddy current is to be produced by the main coil 21.

Therefore, according to the embodiment, an eddy current produced on the RF shield 27 can be reduced.

Furthermore, according to the embodiment, the RF-coil side cooling system 29 includes a plurality of cooling pipes that are arranged in parallel. The inlet-side manifold branches cooling water supplied from the chiller 90, and flows the branched cooling water into each of the cooling pipes. The outlet-side manifold causes the cooling water flowing out from each of the cooling pipes to join each other, and returns it to the chiller 90. Each of the cooling pipes included in the RF-coil side cooling system 29 is connected to each of the inlet-side manifold and the outlet-side manifold via a tube formed from an insulating material. Accordingly, an electrical closed loop can be securely prevented from forming by each of the cooling pipes included in the RF-coil side cooling system 29. Therefore, according to the embodiment, coupling of the cooling pipes and a radio-frequency magnetic field can be avoided, so that uniformity of a static magnetic field in the imaging area can be stabilized.

Moreover, according to the embodiment, the RF-coil side cooling system 29 includes the first cooling pipes 29a that circulate cooling water in a certain direction, and the second cooling pipes 29b that are provided in parallel with the first cooling pipes 29a. The second cooling pipes 29b circulate cooling water in a direction opposite to the direction in which the first cooling pipes 29a circulate cooling water. Therefore, according to the embodiment, the temperature of cooling water is uniformed in the RF-coil side cooling system 29 as a whole, the imaging area in which the subject P is placed can be uniformly cooled.

Furthermore, according to the embodiment, a low dielectric substance is filled between the cooling pipes included in the RF-coil side cooling system 29. Therefore, according to the embodiment, each of the cooling pipes included in the RF-coil side cooling system 29 can be prevented from electrically coupling, so that uniformity of a static magnetic field in the imaging area can be more stabilized.

Moreover, according to the embodiment, the insulating film 28 formed from an insulating material is provided between the cooling pipes included in the RF-coil side cooling system 29 and the RF shield 27. Therefore, according to the embodiment, because electrical coupling of the cooling pipes included the RF-coil side cooling system 29 and the RE shield 27 can be avoided, the uniformity of a static magnetic field in the imaging area can be further stabilized.

Furthermore, according to the embodiment, the RF-coil side cooling system 29 and the main-coil side cooling pipe 26a are provided so as to be on opposite sides of the main coil 21. Accordingly, the main coil 21 can be effectively cooled, so that a temperature rise in the imaging area in which the subject P is placed can be suppressed.

Although the embodiment is explained above in a case where the RF-coil side cooling system 29 includes the first cooling pipes 29a and the second cooling pipes 29b three each, the present invention is not limited to this. For example, when the number of cooling pipes is increased, the length of an individual cooling pipe can be short. As a result, a pressure loss of each of the cooling pipes can be suppressed, so that a flow amount of cooling water can be increased. Accordingly, the imaging area can be cooled more efficiently.

Moreover, although the embodiment is explained above in a case where the first cooling pipes 29a and the second cooling pipes 29b are each arranged in a spiral fashion in the RF-coil side cooling system 29, the present invention is not limited to this. For example, it can be applied to a case where each of the cooling pipes is arranged in parallel along the longitudinal direction of the gradient coil 20.

Figure 10:
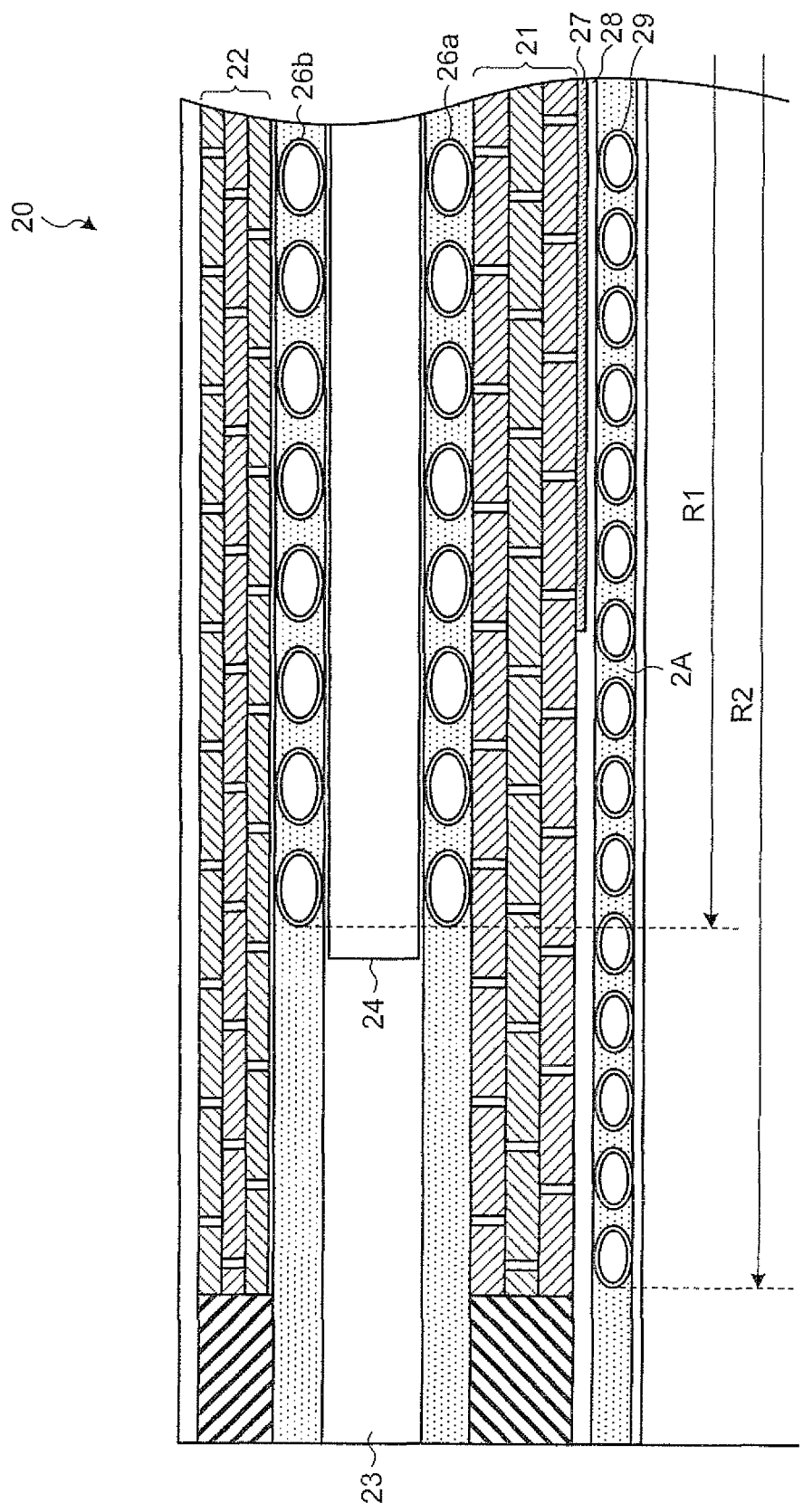
FIG. 10 is a cross-sectional view that depicts an internal structure at an end of the gradient coil.
Figure 11:
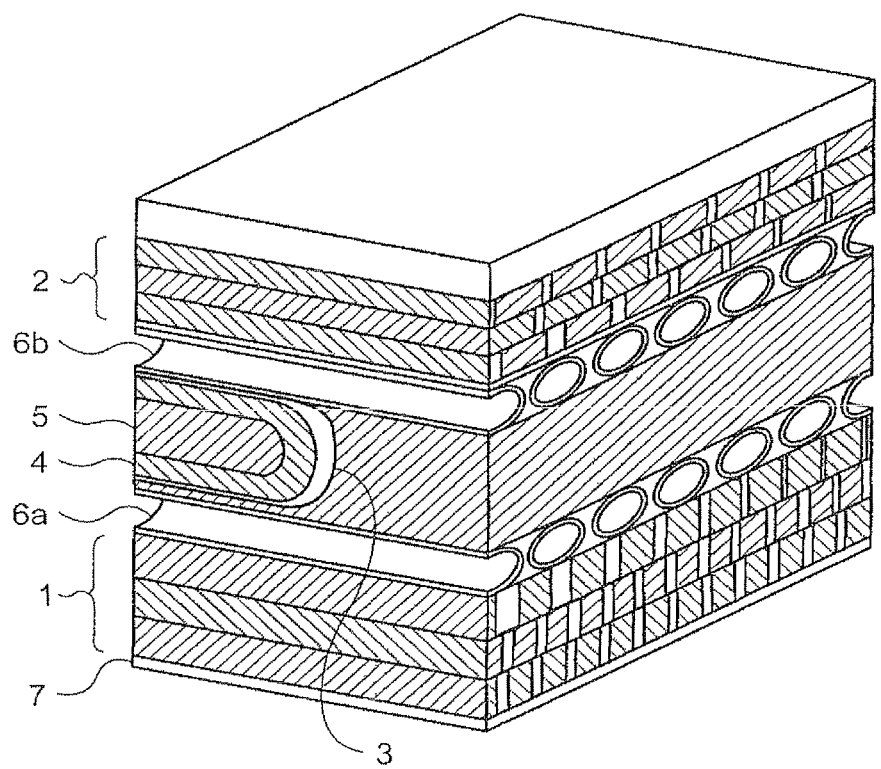
FIG. 11 is a schematic diagram for explaining an example of a conventional technology using cooling pipes.

An internal structure of the gradient coil 20 according to the embodiment is more specifically explained below. FIG. 10 is a cross-sectional view that depicts an internal structure at an end of the gradient coil 20. In FIG. 10, the upper side indicates an outer side of the drum of the gradient coil 20, and the lower side indicates an inner side of the drum. Moreover, in FIG. 10, the left side indicates a side end of the gradient coil 20, and the right side indicates the center side of the gradient coil 20.

As shown in FIG. 10, in the gradient coil 20 according to the embodiment, the shield coil 22, the shield-coil side cooling pipe 26b, the main-coil side cooling pipe 26a, the main coil 21, the RF shield 27, and the RF-coil side cooling system 29 are multilayered in this order from the outer side of the drum (the upper side of FIG. 10) toward the inner side (the lower side of FIG. 10).

Specifically, on the inner side of the shield coil 22, the shield-coil side cooling pipe 26b is arranged. Moreover, on the inner side of the shield-coil side cooling pipe 26b, the main-coil side cooling pipe 26a is arranged such that the shim-tray insert guides 23 for inserting the shim trays are arranged in between the shield-coil side cooling pipe 26b and the main-coil side cooling pipe 26a. The main-coil side cooling pipe 26a and the shield-coil side cooling pipe 26b are each formed in a spiral fashion.

Furthermore, on the inner side of the main-coil side cooling pipe 26a, the main coil 21 is arranged. Moreover, on the inner side of the main coil 21, the RF shield 27 is arranged. Furthermore, on the inner side of the RF shield 27, the RF-coil side cooling system 29 is arranged such that the insulating film 28 is arranged in between the RF shield 27 and the RF-coil side cooling system 29. Each of the cooling pipes included in the RF-coil side cooling system 29 is formed in a spiral fashion. Moreover, a low dielectric substance 2A is filled between the cooling pipes included in the RF-coil side cooling system 29. In this way, according to the embodiment, the RF-coil side cooling system 29 is provided so as to cover the inner surface of the RF shield 27. Accordingly, the RF shield 27 is embedded in the gradient coil 20.

In an MRI apparatus, a high voltage is generated on an RF shield due to an eddy current. For this reason, an earth plate for letting out a voltage generated due to an eddy current is generally provided on the RF shield. Sometimes, a noise is produced by the earth plate in some cases. Moreover, for example, metal powder is sometimes mixed on an RF shield while manufacturing a gradient coil, and a noise is produced in some cases caused by the metal powder.

By contrast, according to the embodiment, because a plurality of slits is formed on the RF shield 27, an eddy current produced on the RF shield 27 can be reduced. Accordingly, earth plate does not need to be provided. Furthermore, according to the embodiment, because the RE shield 27 is embedded in the gradient coil 20, the surface of the RF shield 27 is not exposed. Therefore, this can prevent, for example, metal powder from being mixed onto the RF shield 27 while manufacturing the gradient coil 20. For these reasons, according to the embodiment, production of noise caused by an earth plate, metal powder, or the like, can be avoided. In addition, because an earth plate does not need to be provided, installation manhours of an earth plate and costs of parts can be reduced.

Furthermore, the RF-coil side cooling system 29 is formed to have a longer length in the direction along the spiral axis than the main-coil side cooling pipe 26a and the shield-coil side cooling pipe 26b. Accordingly, as shown in FIG. 10, the RF-coil side cooling system 29 is arranged in a wider area along the drum-extending direction of the gradient coil 20 than the main-coil side cooling pipe 26a and the shield-coil side cooling pipe 26b. In FIG. 10, R1 denotes an area in which the main-coil side cooling pipe 26a and the shield-coil side cooling pipe 26b are arranged. R2 denotes an area in which the RF-coil side cooling system 29 is arranged.

As described above, the cooling pipes included in the RF-coil side cooling system 29 are formed so as to have a smaller pipe diameter than the main-coil side cooling pipe 26a and that of the shield-coil side cooling pipe 26b. As a result, as shown in FIG. 10, the RF-coil side cooling system 29 can be arranged in a wider area along the drum-extending direction of the gradient coil 20 than the main-coil side cooling pipe 26a and the shield-coil side cooling pipe 26b. Therefore, according to the embodiment, a wider area of the gradient coil 20 can be cooled compared with a case of using only the main-coil side cooling pipe 26a and the shield-coil side cooling pipe 26b.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a static magnetic-field magnet configured to generate a static magnetic field in an imaging area in which a subject is to be placed;
a main coil that is provided on an inner side of the static magnetic-field magnet, and which is configured to apply a gradient magnetic field onto the subject when placed in the static magnetic field;
a shield coil that is provided between the static magnetic-field magnet and the main coil, and which is configured to shield the gradient magnetic field generated by the main coil;
a radio-frequency coil that is provided on an inner side of the main coil, and which is configured to apply a radio-frequency magnetic field onto the subject placed inside the static magnetic field;
a radio-frequency shield that is provided between the main coil and the radio-frequency coil, and which is configured to shield the radio-frequency magnetic field generated by the radio-frequency coil; and
an inner-layer cooling pipe that is provided on an inner side of the main coil and between the radio-frequency coil and the radio-frequency shield, and which is configured to pass a coolant in the inner-layer cooling pipe.

2. The magnetic resonance imaging apparatus according to claim 1, wherein the radio-frequency shield comprises an electrically conductive surface formed in a substantially drum shape, said shield being provided between the main coil and the radio-frequency coil, and including a slit that is formed at a position at which an eddy current would be produced by the main coil.

3. The magnetic resonance imaging apparatus according to claim 2, wherein an insulating film formed from an insulating material is provided between the inner-layer cooling pipe and the radio-frequency shield.

4. The magnetic resonance imaging apparatus according to claim 2, further comprising an outer-layer cooling pipe that is provided on an outer side of the main coil, and which is configured to pass a coolant in the inner-layer cooling pipe.

5. The magnetic resonance imaging apparatus according to claim 2, wherein:
the inner-layer cooling pipe includes a plurality of cooling pipes arranged in parallel,
the inner-layer cooling pipe further includes a branching pipe that branches a coolant supplied from a chiller, and flows branched coolant into each of the cooling pipes, and
each of the cooling pipes and the branching pipe included in the inner-layer cooling pipe are connected to each other via a pipe that is formed from an insulating material.

6. The magnetic resonance imaging apparatus according to claim 2, wherein the inner-layer cooling pipe includes a first cooling pipe that passes a coolant in a first direction, and a second cooling pipe provided in parallel with the first cooling pipe, and
the second cooling pipe passes a coolant in a second direction opposite to the first direction in which the first cooling pipe passes the coolant.

7. The magnetic resonance imaging apparatus according to claim 1, wherein an insulating film formed from an insulating material is provided between the inner-layer cooling pipe and the radio-frequency shield.

8. The magnetic resonance imaging apparatus according to claim 1, further comprising an outer-layer cooling pipe that is provided on an outer side of the main coil, and which is configured to pass a coolant in the inner-layer cooling pipe.

9. The magnetic resonance imaging apparatus according to claim 8, wherein the inner-layer cooling pipe is formed so as to have a pipe diameter smaller than a pipe diameter of the outer-layer cooling pipe.

10. The magnetic resonance imaging apparatus according to claim 8, wherein:
the inner-layer cooling pipe and the outer-layer cooling pipe are each formed in a helical shape, and
the inner-layer cooling pipe is formed to have narrower intervals within its helical shape than the outer-layer cooling pipe.

11. The magnetic resonance imaging apparatus according to claim 8, wherein:
the inner-layer cooling pipe and the outer-layer cooling pipe are each arranged in a helical shape, and
the inner-layer cooling pipe is formed so as to have a longer length in a direction along a helical axis than the outer-layer cooling pipe.

12. The magnetic resonance imaging apparatus according to claim 1, wherein:
the inner-layer cooling pipe includes a plurality of cooling pipes arranged in parallel,
the inner-layer cooling pipe further includes a branching pipe that branches a coolant supplied from a chiller, and flows branched coolant into each of the cooling pipes, and
each of the cooling pipes and the branching pipe included in the inner-layer cooling pipe are connected to each other via a pipe that is formed from an insulating material.

13. The magnetic resonance imaging apparatus according to claim 12, wherein a low dielectric substance is filled between each of the cooling pipes included in the inner-layer cooling pipe.

14. The magnetic resonance imaging apparatus according to claim 1, wherein the inner-layer cooling pipe includes a first cooling pipe that respectively; and a coolant in a first direction, and a second cooling pipe provided in parallel with the first cooling pipe, and the second cooling pipe respectively; and a coolant in a second direction opposite to the first direction in which the first cooling pipe respectively; and the coolant.

15. The magnetic resonance imaging apparatus according to claim 1, wherein the inner-layer cooling pipe covers an inner surface of the radio-frequency shield.

* * * * *